(12) United States Patent
Tsai et al.

(10) Patent No.: US 8,829,974 B2
(45) Date of Patent: Sep. 9, 2014

(54) BALANCED FREQUENCY MIXER CIRCUIT

(71) Applicant: National Chi Nan University, Nantou (TW)

(72) Inventors: Tzung-Min Tsai, Nantou (TW); Yo-Sheng Lin, Nantou (TW); Wei-Chen Wen, Nantou (TW)

(73) Assignee: National Chi Nan University, Puli, Nantou (TW)

( * ) Notice: Subject to any disclaimer, the term of this patent is extended or adjusted under 35 U.S.C. 154(b) by 0 days.

(21) Appl. No.: 13/940,604

(22) Filed: Jul. 12, 2013

(65) Prior Publication Data

US 2014/0197874 A1    Jul. 17, 2014

(30) Foreign Application Priority Data

Jan. 17, 2013    (TW) .............................. 102101814 A

(51) Int. Cl.
    *G06F 7/44*        (2006.01)
    *G06G 7/16*        (2006.01)
    *H03D 7/14*        (2006.01)
(52) U.S. Cl.
    CPC .................................. *H03D 7/1441* (2013.01)
    USPC ............................ 327/359; 327/355; 327/357

(58) Field of Classification Search
    USPC ............................................ 327/355, 357, 359
    See application file for complete search history.

(56) References Cited

U.S. PATENT DOCUMENTS

| 6,404,263 | B1 * | 6/2002 | Wang ............................ 327/359 |
| 6,799,029 | B2 * | 9/2004 | Wu ................................ 455/323 |
| 7,142,014 | B1 * | 11/2006 | Groen et al. ..................... 326/55 |
| 8,558,605 | B1 * | 10/2013 | Wang et al. ..................... 327/359 |
| 8,594,609 | B2 * | 11/2013 | Garcia et al. ................... 455/323 |
| 2010/0301920 | A1 * | 12/2010 | Wu ................................ 327/359 |
| 2011/0142093 | A1 * | 6/2011 | De Rosa ......................... 375/130 |
| 2012/0262216 | A1 * | 10/2012 | Chen et al. ..................... 327/356 |
| 2013/0300490 | A1 * | 11/2013 | Wu et al. ........................ 327/355 |
| 2014/0049309 | A1 * | 2/2014 | Chen et al. ..................... 327/355 |

* cited by examiner

*Primary Examiner* — Adam Houston
(74) *Attorney, Agent, or Firm* — Merchant & Gould P.C.

(57) ABSTRACT

A frequency mixer circuit includes a mixer, a load stage, and again stage. The load stage cooperates with the mixer to generate a differential output voltage signal with a mixed frequency according to a differential local oscillator voltage signal and a differential input voltage signal. The gain stage has a transconductance, and a magnitude of the differential current signal and the transconductance have a positive relationship therebetween, so as to result in a positive relationship between the transconductance and a conversion gain which is a ratio of magnitude of the differential output voltage signal to magnitude of the differential input voltage signal.

15 Claims, 7 Drawing Sheets

BALANCED FREQUENCY MIXER CIRCUIT

CROSS-REFERENCE TO RELATED APPLICATION

This application claims priority to Taiwanese Application No. 102101814, filed on Jan. 17, 2013.

BACKGROUND OF THE INVENTION

1. Field of the Invention

The invention relates to a frequency mixer circuit, and more particularly to a balanced frequency mixer circuit.

2. Description of the Related Art

FIG. 1 shows a conventional Gilbert cell mixer including a frequency mixer stage 10, a transconductance stage 20 and resistors R1, R2.

The frequency mixer stage 10 includes transistors Q1, Q2, Q3 and Q4. The gate terminals of the transistors Q1, Q2 cooperate with the gate terminals of the transistors Q3, Q4 to receive a differential local oscillator voltage signal LO from a local oscillator (not shown).

The transconductance stage 20 includes transistors Q5, Q6, and receives an input alternating current (AC) voltage signal $v_{IF}$, so as to generate transconductance stage AC current signals $i_{IF}$.

The resistor R1 has a first terminal receiving a direct current (DC) voltage $V_{DD}$, and a second terminal coupled to the first terminals of the transistors Q1, Q3. The resistor R2 has a first terminal receiving the DC voltage $V_{DD}$, and a second terminal coupled to the first terminals of the transistors Q2, Q4. A mixed frequency voltage signal $v_{RF}$ is outputted at the second terminals of the resistors R1, R2.

Since the voltage signal LO is a differential signal, when the transistors Q1, Q2 conduct, the transistors Q3, Q4 are cut-off, and vice versa.

Through operation of the Gilbert cell mixer, the mixed frequency voltage signal $v_{RF}$ will have a frequency $f_{RF}$ equal to a sum of a frequency $f_{IF}$ of the input AC voltage signal $v_{IF}$ and a frequency of the local oscillator voltage signal $f_{LO}$ (i.e., $f_{RF}=f_{IF}+f_{LO}$)

The conventional Gilbert cell mixer has the following drawbacks:

1. In direct current (DC) analysis, DC currents $I_{DC}$ entirely flow through the resistors R1, R2, resulting in large power consumption.

2. The DC currents $I_{DC}$ cause a large voltage drop between the two terminals of the resistors R1, R2, thereby reducing conversion gain of the Gilbert cell mixer. If amplitude of the input AC voltage signal $v_{IF}$ is increased for a higher conversion gain, linearity of the Gilbert cell mixer may be adversely affected.

SUMMARY OF THE INVENTION

Therefore, an object of the present invention is to provide a balanced frequency mixer circuit that has relatively higher conversion gain while maintaining relatively good linearity.

According to the present invention, a frequency mixer circuit comprises:

a mixer configured to receive a differential local oscillator (LO) voltage signal with a LO frequency, and a differential input voltage signal with an input frequency, and configured to generate a differential current signal having a mixed frequency associated with the LO frequency and the input frequency;

a load stage having an impedance, coupled to the mixer for receiving the differential current signal therefrom, and cooperating with the mixer to generate, based upon the differential current signal and the impedance of the load stage, a differential output voltage signal with the mixed frequency, wherein a ratio of magnitude of the differential output voltage signal to magnitude of the differential input voltage signal is defined as a conversion gain; and a gain stage coupled to the mixer, having a first transconductance, and configured such that a magnitude of the differential current signal and the first transconductance have a positive relationship therebetween, so as to result in a positive relationship between the conversion gain and the first transconductance.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 2:
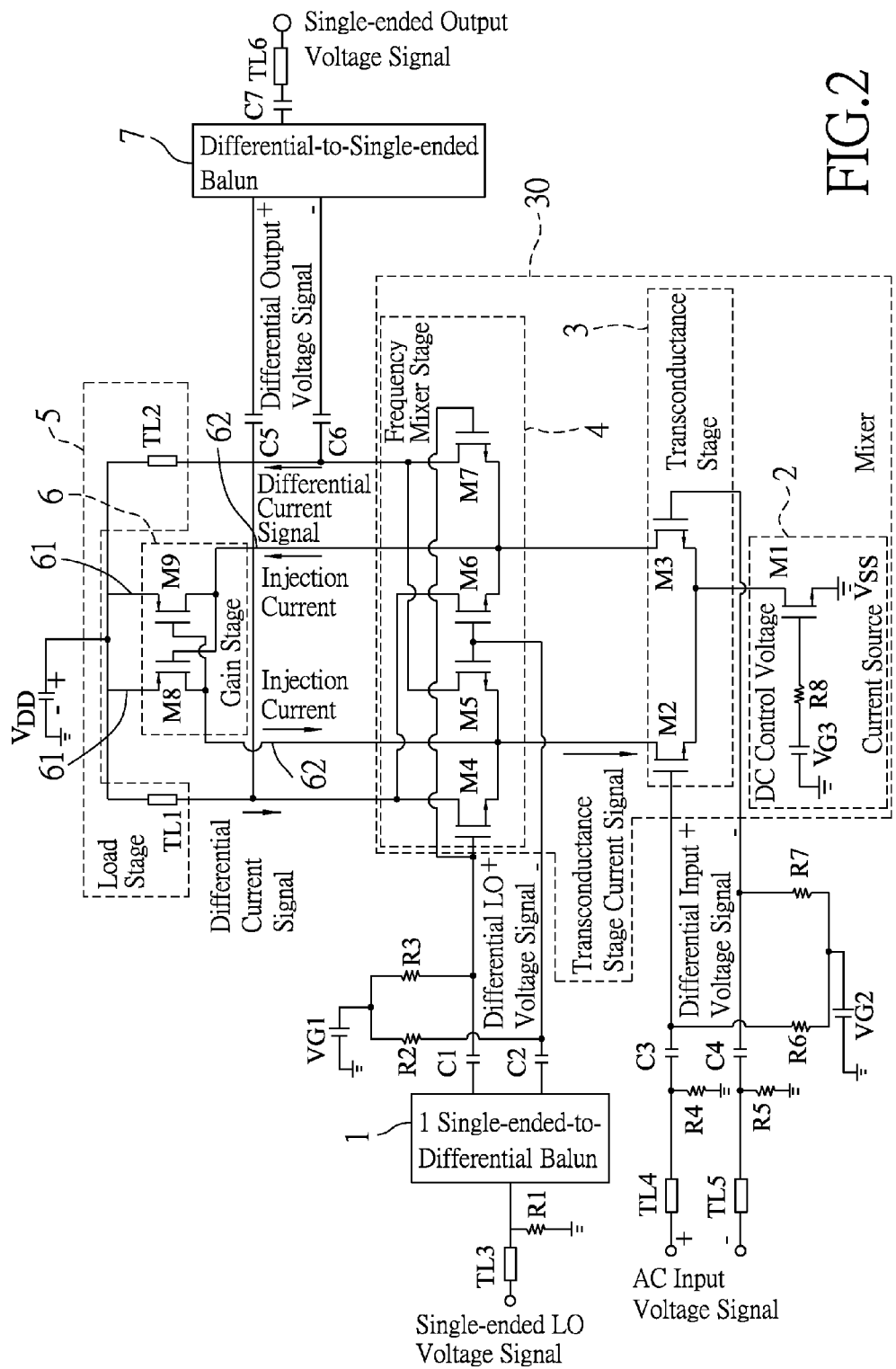
FIG. 2 is a circuit diagram showing a first preferred embodiment of the balanced frequency mixer circuit according to the present invention.

Referring to FIG. 2, the first preferred embodiment of the balanced frequency mixer circuit according to this invention is shown to include a single-ended-to-differential balun 1, a mixer 30, a load stage 5, a gain stage 6 and a differential-to-single-ended balun 7.

The single-ended-to-differential balun 1 receives a single-ended local oscillator (LO) voltage signal, and converts the single-ended LO voltage signal into a differential LO voltage signal with a LO frequency.

The mixer 30 is coupled to the single-ended-to-differential balun 1 for receiving the differential LO voltage signal, receives a differential input voltage signal with an input frequency, and generates a differential current signal having a mixed frequency associated with the LO frequency and the input frequency. For example, when the input frequency is 0.1 GHz and the LO frequency is 59.9 GHz, the mixed frequency is 60 GHz.

The mixer 30 includes a current source 2, a transconductance stage 3 and a frequency mixer stage 4.

The current source 2 is used for providing a bias current, and includes a transistor M1 having a first terminal, a grounded second terminal, and a control terminal receiving a direct current (DC) control voltage. The transistor M1 generates the bias current flowing through the first and second terminals thereof by virtue of the DC control voltage.

The transconductance stage 3 is coupled to the current source 2 for receiving the bias current, receives the differential input voltage signal, and converts the differential input voltage signal into a transconductance stage current signal.

The transconductance stage 3 includes a pair of transistors M2, M3 each having a first terminal, a second terminal and a control terminal. The control terminals of the transistors M2, M3 of the transconductance stage 3 receive the differential input voltage signal. The second terminals of the transistors M2, M3 of the transconductance stage 3 are coupled to each other and to the current source 2 for receiving the bias current. In this embodiment, each of the transistors M2, M3 is an N-type metal-oxide-semiconductor field-effect transistor (MOSFET) having a drain terminal serving as the first terminal thereof, a source terminal serving as the second terminal thereof, and a gate terminal serving as the control terminal thereof.

The frequency mixer stage 4 is coupled to the transconductance stage 3 for receiving the transconductance stage current signal, is coupled to the gain stage for receiving a pair of DC injection currents therefrom, and receives the differential LO voltage signal. The frequency mixer stage 4 generates the differential current signal according to the differential LO voltage signal, the transconductance stage current signal and the DC injection currents, so as to result in the mixed frequency of the differential current signal being substantially equal to a sum of frequencies of the differential LO voltage signal and the transconductance stage current signal, and magnitudes of the differential current signal and the DC injection currents having a positive relationship therebetween.

The frequency mixer stage 4 includes transistors M4, M5, M6 and M7 each having a first terminal, a second terminal and a control terminal.

The control terminals of the transistors M4, M5 receive the differential LO voltage signal. The second terminals of the transistors M4, M5 are coupled together and to the first terminal of the transistor M2 of the transconductance stage 3.

The control terminals of the transistors M6, M7 are coupled respectively to the control terminals of the transistors M5, M4. The second terminals of the transistors M6, M7 are coupled together and to the first terminal of the transistor M3 of the transconductance stage 3.

In this embodiment, each of the transistors M4, M5, M6, M7 is an N-type MOSFET having a drain terminal serving as the first terminal thereof, a source terminal serving as the second terminal thereof, and a gate terminal serving as the control terminal thereof.

The load stage 5 has an impedance, is coupled to the mixer 30 for receiving the differential current signal therefrom, and cooperates with the mixer 30 to generate, based upon the differential current signal and the impedance of the load stage 5, a differential output voltage signal with the mixed frequency. It should be noted that, a ratio of magnitude of the differential output voltage signal to magnitude of the differential input voltage signal is defined as a conversion gain throughout this specification.

The load stage 5 includes a pair of load components TL1, TL2 each having first and second terminals. The first terminal of each of the load components TL1, TL2 receives a DC bias voltage $V_{DD}$. The second terminal of the load component TL1 is coupled to the first terminals of the transistors M4, M6, and the second terminal of the load component TL2 is coupled to the first terminals of the transistors M5, M7. The differential output voltage signal is outputted at the second terminals of the load components TL1, TL2 according to the differential current signal and the impedances of the load components TL1, TL2.

The gain stage 6 is coupled to the mixer 30, has a first transconductance, and is configured such that a magnitude of the differential current signal and the first transconductance have a positive relationship therebetween, so as to result in a positive relationship between the conversion gain and the first transconductance.

The gain stage 6 has a bias terminal 61 receiving the DC bias voltage $V_{DD}$, and a pair of current injection terminals 62 respectively coupled to the first terminals of the transistors M2, M3 of the transconductance stage 3. The gain stage 6 is configured to have an equivalent first negative resistance between the bias terminal 61 and each of the current injection terminals 62, and to output, based upon the DC bias voltage $V_{DD}$, the DC injection currents to the transconductance stage 3 of the mixer 30 via the current injection terminals 62, respectively.

The gain stage 6 includes transistors M8, M9 each having a first terminal, a second terminal and a control terminal. Both of the first terminals of the transistors M8, M9 are coupled to the bias terminal 61 of the gain stage 6 to receive the DC bias voltage $V_{DD}$. The second terminals of the transistors M8, M9 respectively serve as the current injection terminals 62 of the gain stage 6. The control terminals of the transistors M8, M9 are coupled respectively to the second terminals of the transistors M9, M8.

In this embodiment, each of the transistors M8, M9 is a P-type MOSFET having a source terminal serving as the first terminal thereof, a drain terminal serving as the second terminal thereof, and a gate terminal serving as the control terminal thereof.

Figure 3:
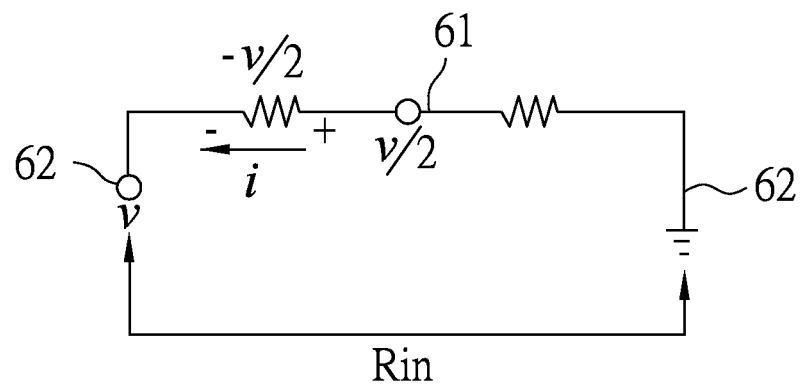
FIG. 3 is a schematic diagram for deriving a negative resistance of a gain stage of the first preferred embodiment.

FIG. 3 shows an equivalent circuit of the gain stage 6 for deriving that the gain stage 6 has an equivalent first negative resistance between the bias terminal 61 and each of the current injection terminals 62, where the transistors M8, M9 are assumed to have the same transconductance $gm_{8,9}$, and v represents a voltage between the second terminals of the transistors M8, M9 (current injection terminals 62). Since the differential voltage between the current injection terminals 62 results in a switching operation between the transistors M8, M9, a current i only flows through one of the transistors M8, M9 at a time, and the magnitude of the current i can be obtained according to the following calculation:

$$i = \frac{\frac{v}{2} - v}{\frac{1}{gm_{8,9}}} = -\frac{v \times gm_{8,9}}{2}$$

Input impedance Rin between the current injection terminals 62 is then obtained as:

$$Rin = \frac{v}{i} = -\frac{2}{gm_{8,9}}$$

The first negative resistance between the bias terminal 61 and each of the current injection terminals 62 is thus derived since it is one half of the input impedance Rin.

The first preferred embodiment of the balanced frequency mixer circuit has a conversion gain $CG_1$ as follows:

$$CG_1 = \frac{2}{\pi} \times \frac{G_{m,LO}}{G_{m,LO} - g_{m8,9}} g_{m2,3} \omega_{RF} L$$

where $G_{m,LO}$ represents an equivalent transconductance of the frequency mixer stage 4, $\Omega_{RF}$ represents an angular frequency of the differential output voltage signal, and L represents an inductance of each of the load components TL1, TL2.

It is evident from the above equation of the conversion gain that, the greater the transconductance $gm_{8,9}$ of the transistors M8, M9 is, the greater will be the conversion gain $CG_1$.

The differential-to-single-ended balun 7 is coupled to the mixer 30 for receiving the differential output voltage signal, and converts the differential output voltage signal into a single-ended output voltage signal.

Figure 1:
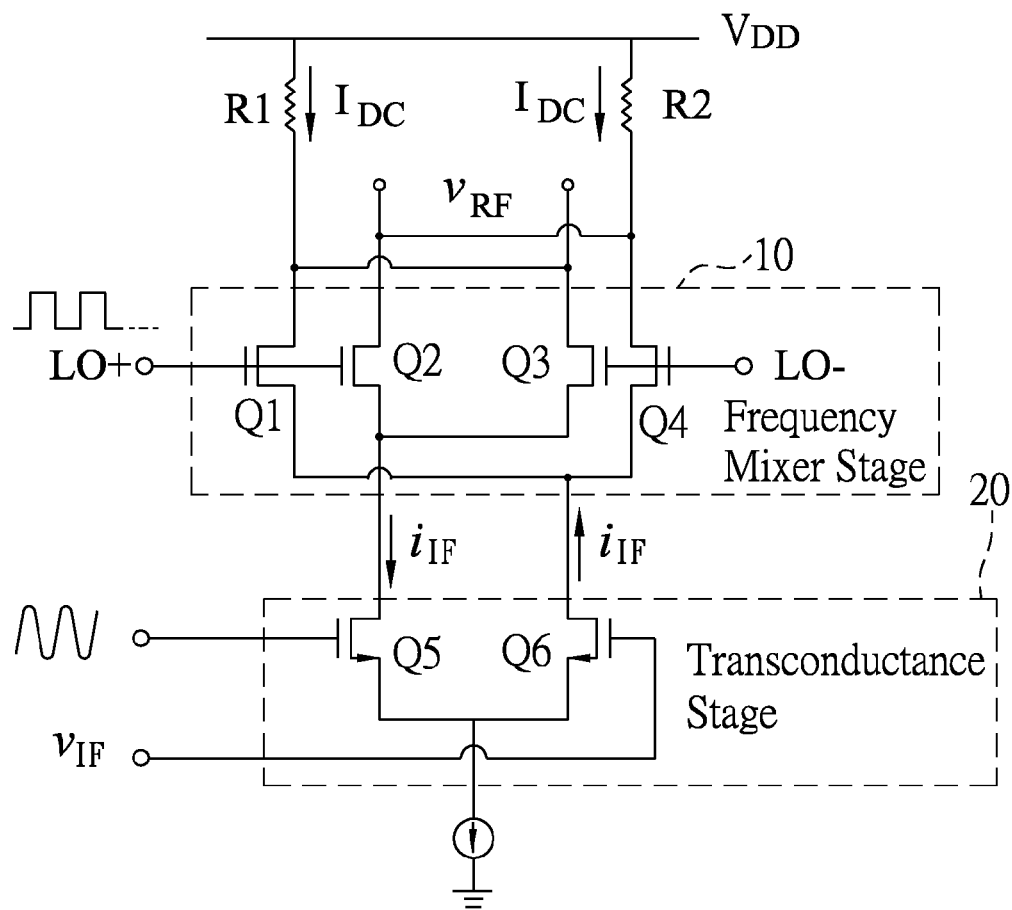
FIG. 1 is a circuit diagram showing a conventional Gilbert cell mixer.

By virtue of the gain stage 6, a large portion of current flowing through the frequency mixer stage 4 is from the gain stage 6, and only a small portion of the current is from the load components TL1, TL2. Compared to the conventional Gilbert cell mixer shown in FIG. 1, DC power consumption of the load components TL1, TL2 is reduced. In addition, since the DC current flowing through the load components TL1, TL2 is relatively small, the voltage drop across each of the load components TL1, TL2 is much smaller than that in the conventional Gilbert cell mixer. Therefore, the present invention does not need to increase the differential input voltage for obtaining the desired conversion gain, thereby maintaining relatively good linearity.

In alternating current (AC) analysis, since the differential output voltage signal is generated at the second terminals of the load components TL1, TL2 as a result of the differential current signal, even if the DC current flowing through the load components TL1, TL2 becomes smaller, the differential output voltage signal will not be smaller.

Figure 4:
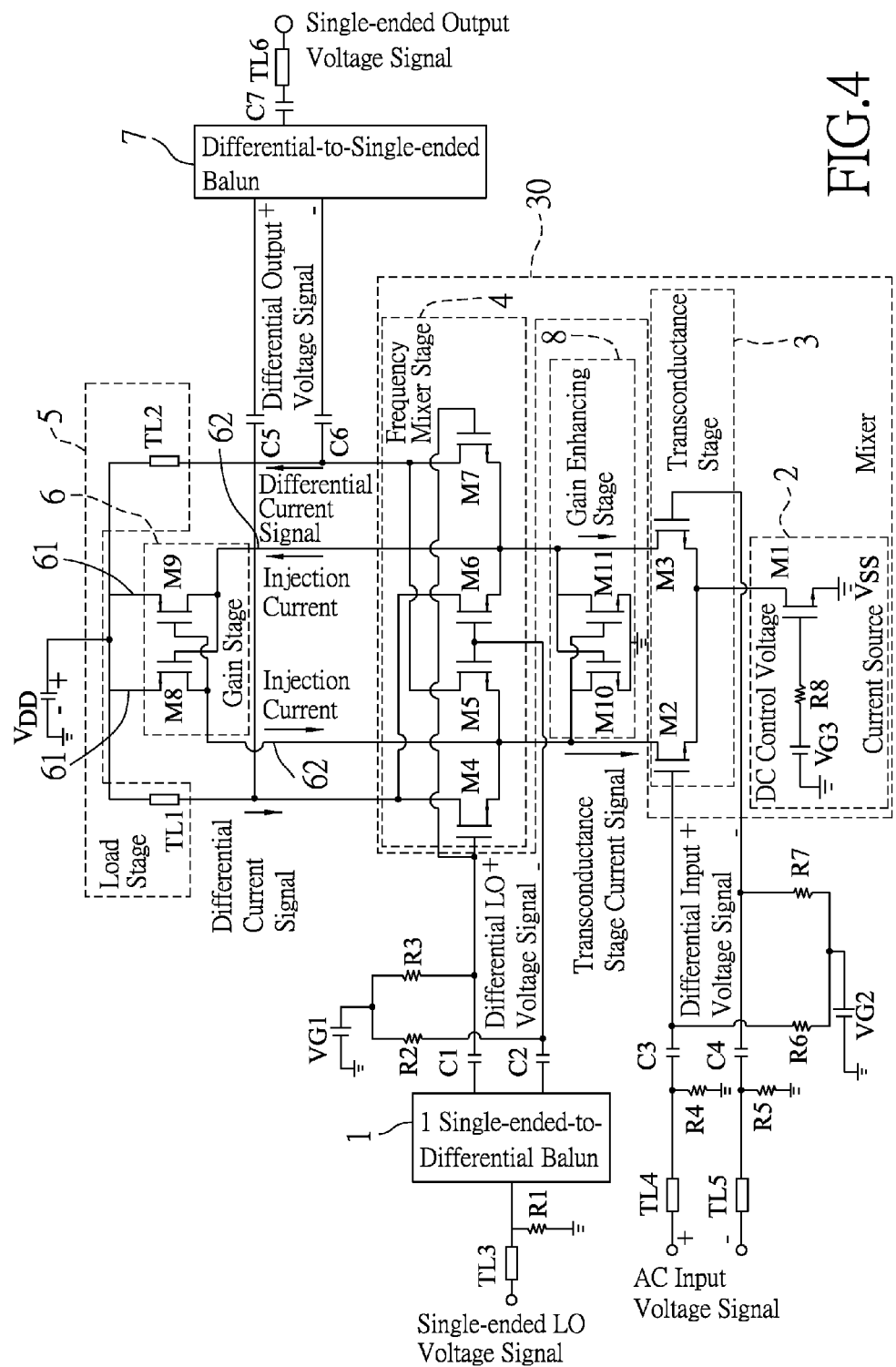
FIG. 4 is a schematic diagram showing a second preferred embodiment of the balanced frequency mixer circuit according to the present invention.

Referring to FIG. 4, a second preferred embodiment of the balanced frequency mixer circuit according to this invention is shown to be similar to the first preferred embodiment, and further includes a gain enhancing stage 8.

The gain enhancing stage 8 has a second transconductance, is coupled to the frequency mixer stage 30, and is configured such that the magnitude of the differential current signal has a positive relationship with a sum of the first and second transconductances, so as to result in a positive relationship between the conversion gain and the sum of the first and second transconductances.

The gain enhancing stage 8 includes transistors M10, M11 each having a first terminal, a grounded second terminal and a control terminal. The first terminals of transistors M10, M11 are coupled respectively to the current injection terminals 62 of the gain stage 6. The control terminals of the transistors M10, M11 are coupled respectively to the first terminals of the transistors M11, M10. In this embodiment, Each of the transistors M10, M11 is an N-type MOSFET having a drain terminal serving as the first terminal thereof, a source terminal serving as the second terminal thereof, and a gate terminal serving as the control terminal thereof. The gain enhancing stage 8 is configured to have an equivalent second negative resistance between the first terminals of the transistors M10, M11. The derivation of the second negative resistance is similar to that described above in conjunction with FIG. 3.

The second preferred embodiment of the balanced frequency mixer circuit has the conversion gain $CG_2$ as follows:

$$CG_1 = \frac{2}{\pi} \times \frac{G_{m,LO}}{G_{m,LO} - g_{m8,9} - g_{m10,11}} g_{m2,3} \omega_{RF} L$$

where $gm_{10,11}$ represents a transconductance of the transistors M10, M11.

It is evident from the above equation of the conversion gain that, the greater the transconductance $gm_{10,11}$ of the transistors M10, M11 is, the greater will be the conversion gain $CG_2$.

Figure 5:
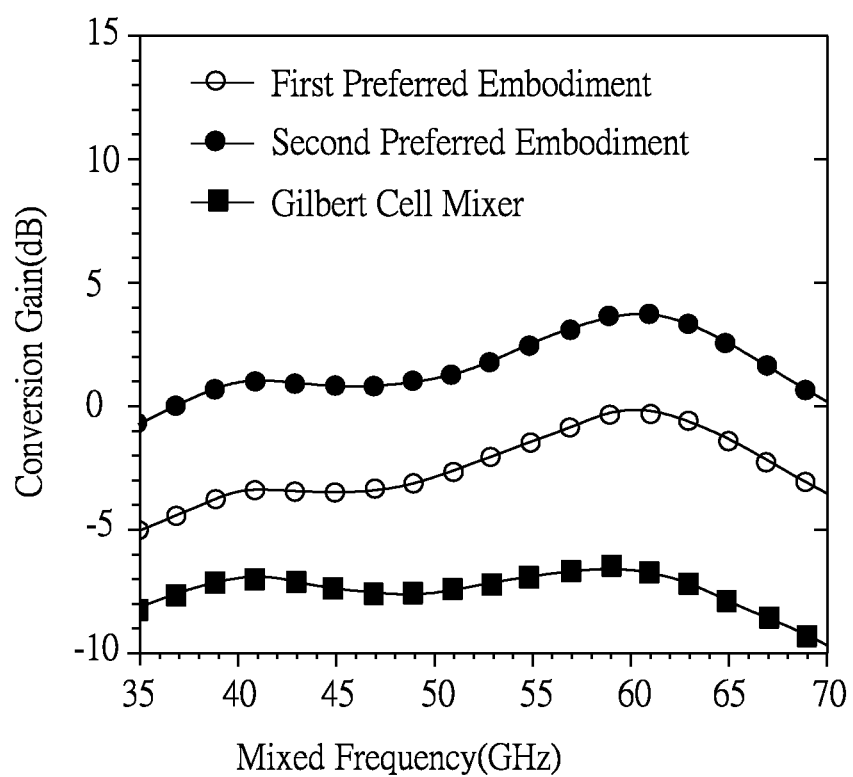
FIG. 5 is a plot showing conversion gains of the conventional Gilbert cell mixer, the first preferred embodiment and the second preferred embodiment.

FIG. 5 is a plot showing conversion gains of the conventional Gilbert cell mixer (i.e., removing the transistors M8-M11 from the second preferred embodiment), the first preferred embodiment (i.e., removing the transistors M10, M11 from the second preferred embodiment) and the second preferred embodiment. Parameters used in the second preferred embodiment for implementing a 60 GHz up-conversion mixer are listed in the following Table 1.

TABLE 1

| TL1 | 118.9 pH | R1 | 63.08 Ω |
|---|---|---|---|
| TL2 | 118.9 pH | R2 | 166.27 Ω |
| TL3 | 60.88 pH | R3 | 166.27 Ω |
| TL4 | 31.6 pH | R4 | 23.44 Ω |
| TL5 | 31.6 pH | R5 | 23.44 Ω |
| TL6 | 14.62 pH | R6 | 10.5 kΩ |
| C1 | 157.21 pF | R7 | 10.5 kΩ |
| C2 | 157.21 pF | R8 | 26.76 Ω |
| C3 | 3.81 pF | $V_{DD}$ | 1.2 V |
| C4 | 3.81 pF | VG1 | 1.15 V |
| C5 | 616.68 fF | VG2 | 0.67 V |
| C6 | 616.68 fF | VG3 | 0.84 V |
| C7 | 157.21 fF | | |

FIG. 5 illustrates that the conversion gain of the second preferred embodiment is greater than that of the first preferred embodiment, and that the conversion gain of the first preferred embodiment is greater than that of the conventional Gilbert cell mixer, which verifies that the gain stage 6 and the gain enhancing stage 8 promote the conversion gain.

Figure 6:
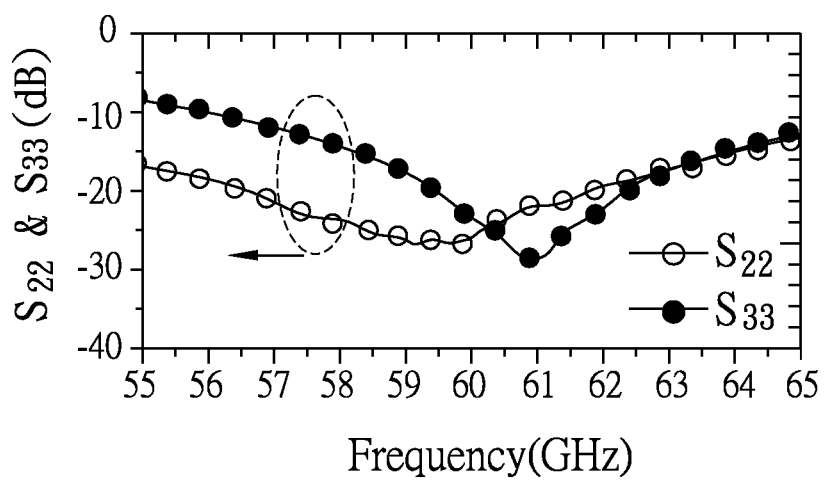
FIG. 6 is a plot showing S-parameters of the second preferred embodiment.

FIG. 6 is a plot showing S-parameters $S_{22}$, $S_{33}$ with the scanned LO frequency of the second preferred embodiment. $S_{22}$ represents an S-parameter of a single-ended port of the single-ended-to-differential balun 1, and $S_{33}$ represents an S-parameter of a single-ended port of the differential-to-single-ended balun 7. At 59.9 GHz, both of the S-parameters S22, S33 are about −26.5 dB, which shows good energy transmission. Furthermore, the 3 dB bandwidth is 4.4 GHz (57.7 GHz~62.1 GHz).

Figure 7:
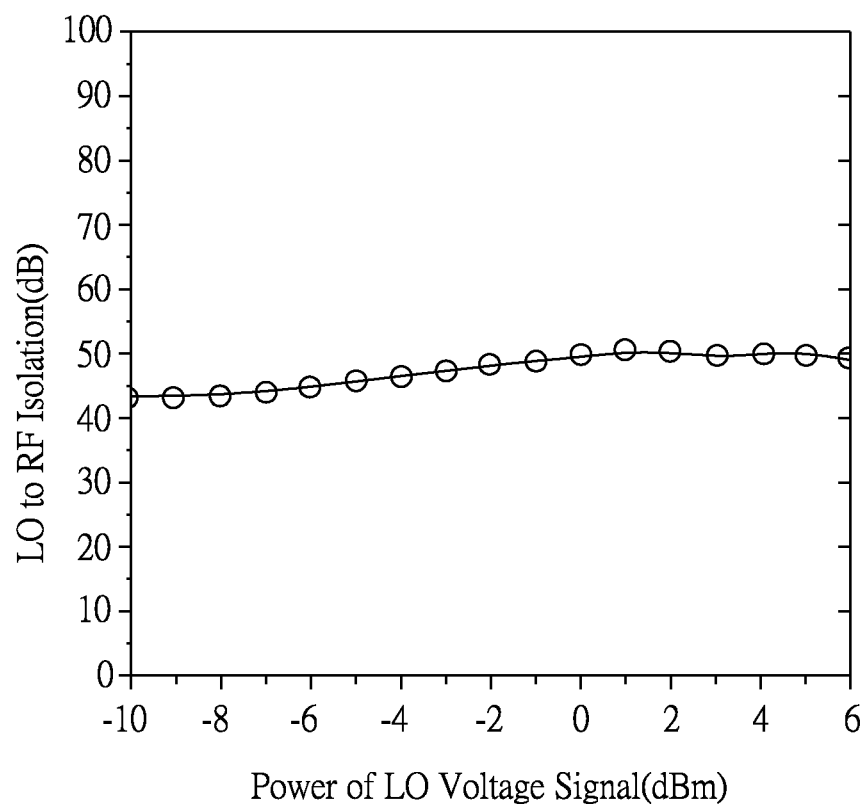
FIG. 7 is a plot showing a relationship between LO to RF isolation and power of LO voltage signal.

FIG. 7 is a plot showing isolation between the single-ended ports of the single-ended-to-differential balun 1 and the differential-to-single-ended balun 7 (LO to RF isolation) versus power of the single-ended LO voltage signal with the mixed frequency being 60 GHz. FIG. 7 shows good LO to RF isolation.

The following Table 2 lists some other parameters and measurement results using the second preferred embodiment with the parameters listed in Table 1.

TABLE 2

| Mixed Frequency (GHz) | 57.7~62.1 |
|---|---|
| Input Frequency (GHz) | 0.1 |
| Conversion Gain (dB) | 2.2~4 |
| LO to RF Isolation (dB) | 48.8 |
| Bandwidth of Differential Input Voltage Signal (GHz) | 0~2.2 |
| Power Consumption (mW) | 8.8 |
| 1-dB compression point (dBm) | −10.1 |

TABLE 2-continued

| | |
|---|---|
| $3^{rd}$ - order intercept point IIP3(dBm) | −2.15 |
| CMOS process | 90 nm |

From Table 2, it is evident that the second preferred embodiment has high conversion gain (4 dB max.), low power consumption (compared to 24 mW of the conventional Gilbert cell mixer), and good linearity (IIP3=−2.15 dBm).

To sum up, the balanced frequency mixer circuit according to the present invention has relatively high conversion gain by virtue of the gain stage 6 and the gain enhancing stage 8. In addition, the present invention has relatively low power consumption while maintaining good linearity since a large portion of the DC current flowing through the frequency mixer stage 4 comes from the gain stage 6, and only a small portion of the DC current comes from the load components TL1, TL2.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A frequency mixer circuit comprising:
    a mixer configured to receive a differential local oscillator (LO) voltage signal with a LO frequency, and a differential input voltage signal with an input frequency, and configured to generate a differential current signal having a mixed frequency associated with the LO frequency and the input frequency;
    a load stage having an impedance, coupled to said mixer for receiving the differential current signal therefrom, and cooperating with said mixer to generate, based upon the differential current signal and the impedance of said load stage, a differential output voltage signal with the mixed frequency, wherein a ratio of magnitude of the differential output voltage signal to magnitude of the differential input voltage signal is defined as a conversion gain; and
    a gain stage coupled to said mixer, having a first transconductance, and configured such that a magnitude of the differential current signal and the first transconductance have a positive relationship therebetween, so as to result in a positive relationship between the conversion gain and the first transconductance.

2. The frequency mixer circuit as claimed in claim 1, wherein said gain stage has a bias terminal disposed to receive a direct-current (DC) bias voltage, and a pair of current injection terminals coupled to said mixer, said gain stage being configured to have an equivalent first negative resistance between said bias terminal and each of said current injection terminals, and to output, based upon the DC bias voltage, a pair of DC injection currents to said mixer via said current injection terminals, respectively.

3. The frequency mixer circuit as claimed in claim 2, wherein said gain stage includes first and second transistors each having a first terminal, a second terminal and a control terminal, both of said first terminals of said first and second transistors being disposed to receive the DC bias voltage, said second terminals of said first and second transistors respectively serving as said current injection terminals of said gain stage, said control terminals of said first and second transistors being coupled respectively to said second terminals of said second and first transistors.

4. The frequency mixer circuit as claimed in claim 2, wherein said mixer includes:
    a current source for providing a bias current;
    a transconductance stage coupled to said current source for receiving the bias current, disposed to receive the differential input voltage signal, and configured to convert the differential input voltage signal into an transconductance stage current signal; and
    a frequency mixer stage coupled to said transconductance stage for receiving the transconductance stage current signal, coupled to said current injection terminals of said gain stage for receiving the DC injection currents, and disposed to receive the differential LO voltage signal, said frequency mixer stage being configured to generate the differential current signal according to the differential LO voltage signal, the transconductance stage current signal and the DC injection currents, so as to result in the mixed frequency of the differential current signal being substantially equal to a sum of frequencies of the differential LO voltage signal and the transconductance stage current signal, and magnitudes of the differential current signal and the DC injection currents having a positive relationship therebetween.

5. The frequency mixer circuit as claimed in claim 4, wherein said transconductance stage includes a pair of transistors each having a first terminal, a second terminal and a control terminal, said control terminals of said transistors of said transconductance stage being disposed to receive the differential input voltage signal, said second terminals of said transistors of said transconductance stage being coupled to each other and to said current source for receiving the bias current, said first terminals of said transistors of said transconductance stage being respectively coupled to said current injection terminals of said gain stage.

6. The frequency mixer circuit as claimed in claim 5, wherein each of said transistors of said transconductance stage is an N-type MOSFET having a drain terminal serving as said first terminal thereof, a source terminal serving as said second terminal thereof, and a gate terminal serving as said control terminal thereof.

7. The frequency mixer circuit as claimed in claim 4, wherein said frequency mixer stage includes first, second, third and fourth transistors each having a first terminal, a second terminal and a control terminal,
    said control terminals of said first and second transistors being disposed to receive the differential LO voltage signal, said second terminals of said first and second transistors being coupled together and to one of said current injection terminals of said gain stage,
    said control terminals of said third and fourth transistors being coupled respectively to said control terminals of said second and first transistors, said second terminals of said third and fourth transistors being coupled together and to the other one of said current injection terminals of said gain stage.

8. The frequency mixer circuit as claimed in claim 7, wherein said load stage includes a pair of load components each having first and second terminals, said first terminal of each of said load components being disposed to receive the DC bias voltage, said second terminal of one of said load components being coupled to said first terminals of said first and third transistors, and said second terminal of the other one of said load components being coupled to said first terminals of said second and fourth transistors, the differential output voltage signal being outputted at said second terminals of said load components.

9. The frequency mixer circuit as claimed in claim 8, wherein said gain stage includes fifth and sixth transistors each having a first terminal, a second terminal and a control terminal, said first terminals of said fifth and sixth transistors being disposed to receive the DC bias voltage, said second terminals of said fifth and sixth transistors respectively serving as said current injection terminals of said gain stage, said control terminals of said fifth and sixth transistors being coupled respectively to said second terminals of said sixth and fifth transistors.

10. The frequency mixer circuit as claimed in claim 9, wherein each of said fifth and sixth transistors of said gain stage is a P-type MOSFET having a source terminal serving as said first terminal thereof, a drain terminal serving as said second terminal thereof, and a gate terminal serving as said control terminal thereof.

11. The frequency mixer circuit as claimed in claim 7, wherein each of said first, second, third and fourth transistors of said frequency mixer stage is an N-type MOSFET having a drain terminal serving as said first terminal thereof, a source terminal serving as said second terminal thereof, and a gate terminal serving as said control terminal thereof.

12. The frequency mixer circuit as claimed in claim 4, further comprising a gain enhancing stage having a second transconductance, coupled to said frequency mixer stage, and configured such that the magnitude of the differential current signal has a positive relationship with a sum of the first and second transconductances, so as to result in a positive relationship between the conversion gain and the sum of the first and second transconductances.

13. The frequency mixer circuit as claimed in claim 12, wherein said gain enhancing stage includes first and second transistors each having a first terminal, a grounded second terminal and a control terminal, said first terminals of said first and second transistors being coupled respectively to said current injection terminals of said gain stage, said control terminals of said first and second transistors being coupled respectively to said first terminals of said second and first transistors, said gain enhancing stage being configured to have an equivalent second negative resistance between said first terminals of said first and second transistors.

14. The frequency mixer circuit as claimed in claim 13, wherein each of said first and second transistors is an N-type MOSFET having a drain terminal serving as said first terminal thereof, a source terminal serving as said second terminal thereof, and a gate terminal serving as said control terminal thereof.

15. The frequency mixer circuit as claimed in claim 1, further comprising:
  a single-ended-to-differential balun disposed to receive a single-ended LO voltage signal, configured to convert the single-ended LO voltage signal into the differential LO voltage signal, and coupled to said mixer for providing the differential LO voltage signal thereto; and
  a differential-to-single-ended balun coupled to said mixer for receiving the differential output voltage signal, and configured to convert the differential output voltage signal into a single-ended output voltage signal.

* * * * *